(12) United States Patent
Patil et al.

(10) Patent No.: US 9,036,367 B2
(45) Date of Patent: *May 19, 2015

(54) MOBILE WIRELESS COMMUNICATIONS DEVICE WITH RF SHIELD AND RELATED METHODS

(71) Applicant: BLACKBERRY LIMITED, Waterloo (CA)

(72) Inventors: Prabhu V. Patil, Round Lake, IL (US); Roberto Gautier, Davie, FL (US); Paul Brian Koch, Plantation, FL (US); Adrian Piseu Davis, Hallandale, FL (US); Nirajkumar Rajendraku Patel, Gainesville, FL (US)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/205,484

(22) Filed: Mar. 12, 2014

(65) Prior Publication Data

US 2014/0192508 A1    Jul. 10, 2014

Related U.S. Application Data

(63) Continuation of application No. 12/903,619, filed on Oct. 13, 2010, now Pat. No. 8,700,108.

(60) Provisional application No. 61/348,138, filed on May 25, 2010.

(51) Int. Cl.
  H05K 9/00      (2006.01)
  H04B 15/02     (2006.01)

(52) U.S. Cl.
  CPC ............. *H05K 9/0024* (2013.01); *H04B 1/525* (2013.01); *H04B 15/02* (2013.01); *H05K 9/0026* (2013.01)

(58) Field of Classification Search
  None
  See application file for complete search history.

(56) References Cited

U.S. PATENT DOCUMENTS

| 6,150,898 | A  | 11/2000 | Kushitani et al. |
| 7,327,328 | B2 | 2/2008  | Yoneya et al. |
| 7,502,598 | B2 | 3/2009  | Kronberger et al. |
| 7,697,905 | B2 | 4/2010  | Lee et al. |
| 7,745,925 | B2 | 6/2010  | Kim |
| 2003/0232603 | A1 | 12/2003 | Tanaka et al. |
| 2005/0001773 | A1 | 1/2005  | Morningstar et al. |
| 2007/0200248 | A1 | 8/2007  | Ong |
| 2008/0007475 | A1 | 1/2008  | Zhu et al. |
| 2008/0158804 | A1 | 7/2008  | Chen et al. |
| 2008/0178463 | A1 | 7/2008  | Okubora |
| 2009/0033805 | A1 | 2/2009  | Miyake et al. |
| 2009/0093286 | A1 | 4/2009  | Zhu et al. |
| 2009/0156127 | A1 | 6/2009  | Zhu et al. |
| 2009/0280757 | A1 | 11/2009 | Zhu et al. |

FOREIGN PATENT DOCUMENTS

| EP | 1161128 | 12/2001 |
| EP | 2117125 | 11/2009 |
| WO | 2005051062 | 6/2005 |

*Primary Examiner* — Gerald Johnson
(74) *Attorney, Agent, or Firm* — Allen, Dyer, Doppelt, Milbrath & Gilchrist, P.A.

(57) ABSTRACT

A mobile wireless communications device may include a housing, an antenna carried by the housing, and a circuit board carried by the housing. The mobile wireless communications device may also include a power amplifier carried by the circuit board, an antenna switch carried by the circuit board and configured to selectively couple the power amplifier to the antenna, a first radio frequency (RF) shield covering the power amplifier and the antenna switch, and a second RF shield within the first RF shield and covering the antenna switch.

34 Claims, 9 Drawing Sheets

US 9,036,367 B2

MOBILE WIRELESS COMMUNICATIONS DEVICE WITH RF SHIELD AND RELATED METHODS

TECHNICAL FIELD

The present disclosure relates to the field of mobile wireless communications devices, and, more particularly, to radio frequency shields in mobile wireless communication devices and related methods.

BACKGROUND

Cellular communication systems continue to grow in popularity and have become an integral part of both personal and business communications. Cellular telephones allow users to place and receive phone calls most anywhere they travel. Moreover, as cellular telephone technology is increased, so too has the functionality of cellular devices. For example, many cellular devices now incorporate Personal Digital Assistant (PDA) features such as calendars, address books, task lists, calculators, memo and writing programs, etc. These multi-function devices usually allow users to wirelessly send and receive electronic mail (email) messages and access the internet via a cellular network and/or a wireless local area network (WLAN), for example.

As the functionality of cellular communications devices continues to increase, so too does demand for smaller devices that are easier and more convenient for users to carry. As many circuit boards and electronic components thereon are reduced in size and placed closer together, including antenna and other radio frequency (RF) components, including power amplifiers and antenna switches, various electronic components can pick up conductive energy and create interference within the system. For example, some components could pick up conducted energy directly from a power amplifier or from the radiated energy emitted by an antenna. This unwanted reception of conducted/near field radiated energy from power amplifiers and antennas may be particularly problematic in a packet burst transmission as part of a Global System for Mobile communications (GSM) system, including the 850 MHz, 900 MHz, 1800 MHz and 1900 MHz frequency bands.

Some mobile wireless communications devices have a RF metal shield, i.e. a "can," that forms a compartment on a circuit board and receives RF circuitry therein, for example, the power amplifier and antenna switch (typically a diplexer antenna switch also termed a transmit/receiver antenna switch). One or more metallic "cans" can form radio frequency isolation compartments that may include a transceiver chip set in one "can" and the power amplifier and antenna switch in another "can" to aid RF filtering between the RF power amplifier and the antenna switch. Some signal coupling through the RF shield may be created from voltage standing waves of single or multiple harmonics, thus bypassing various components, such as filters that are formed to prevent such coupling.

DETAILED DESCRIPTION OF THE PREFERRED EMBODIMENTS

Figure 1:
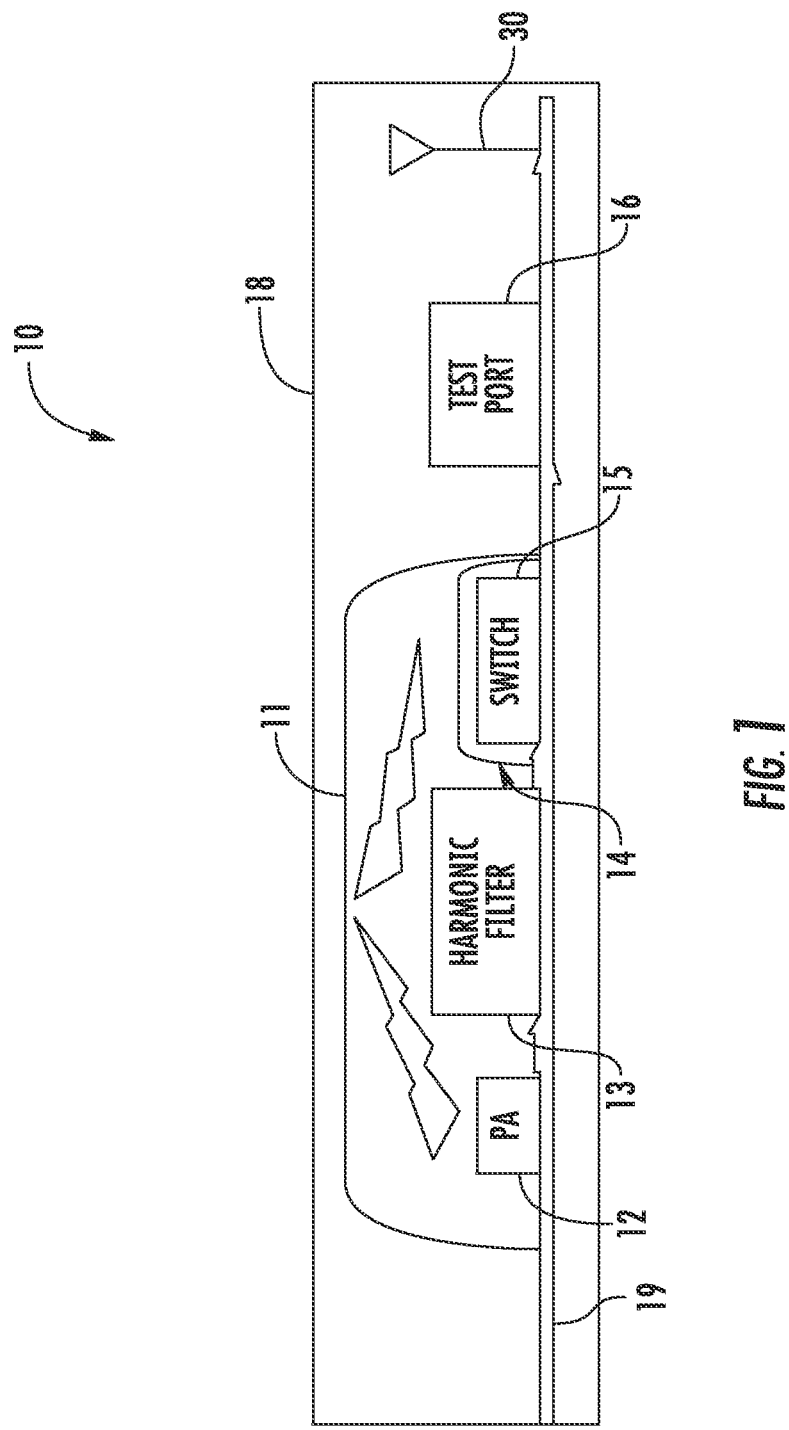
FIG. 1 is a schematic diagram of a mobile wireless communications device, according to the present disclosure.
Figure 2:
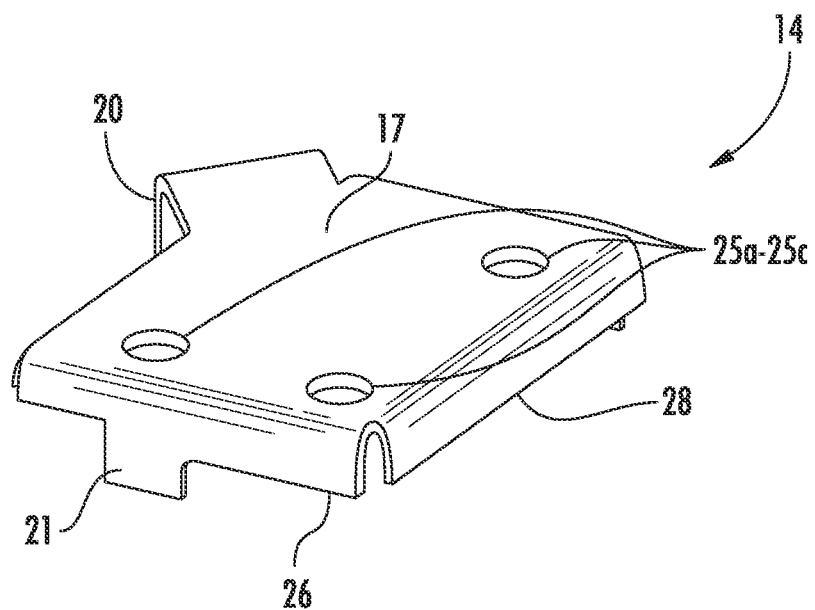
FIG. 2 is a perspective view of the second RF shield from FIG. 1.
Figure 3:
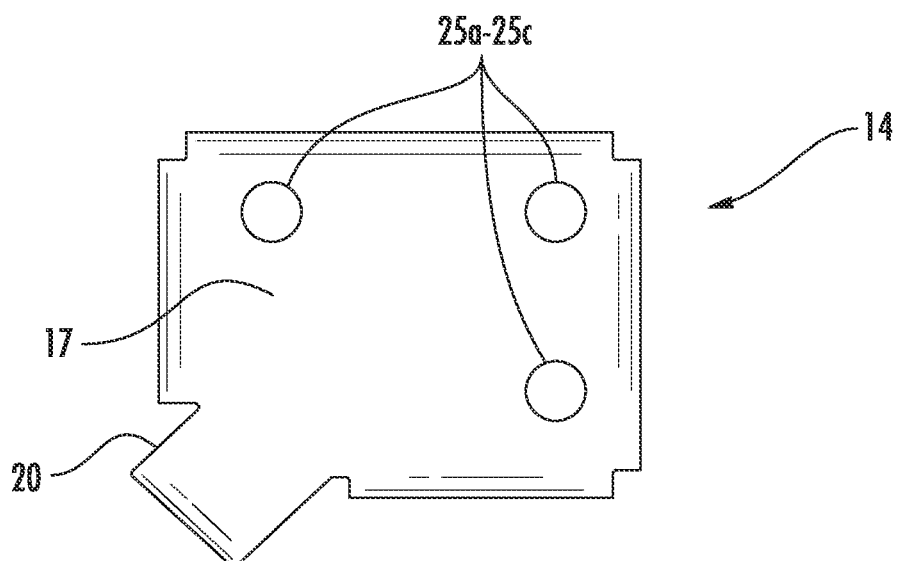
FIG. 3 is a top plan view of the second RF shield from FIG. 1.
Figure 4:
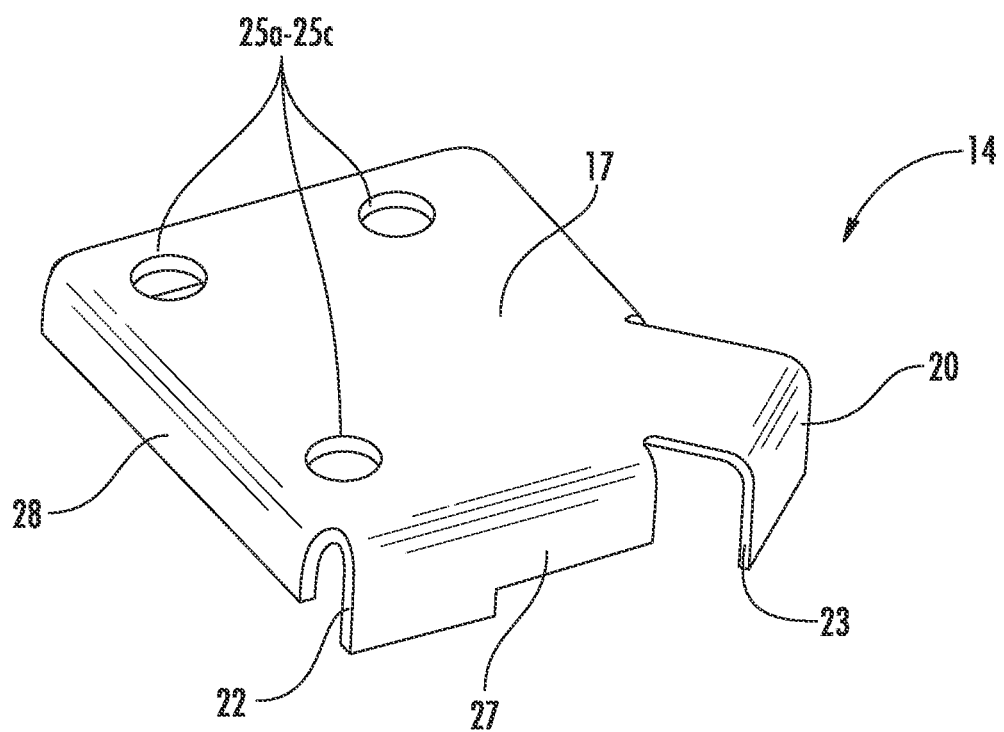
FIG. 4 is another perspective view of the second RF shield from FIG. 1.

The present description is made with reference to the accompanying drawings, in which various example embodiments are shown. However, many different example embodiments may be used, and thus the description should not be construed as limited to the example embodiments set forth herein. Rather, these example embodiments are provided so that this disclosure will be thorough and complete. Like numbers refer to like elements throughout, and prime/multiple prime notation is used to indicate similar elements in alternative embodiments.

An aspect of the present disclosure is directed to a mobile wireless communications device. The mobile wireless communications device may comprise a housing, an antenna carried by the housing, a circuit board carried by the housing, a power amplifier carried by the circuit board, and an antenna switch carried by the circuit board and configured to selectively couple the power amplifier to the antenna. The mobile wireless communications device may further comprise a first radio frequency (RF) shield covering the power amplifier and the antenna switch, and a second RF shield within the first RF shield and covering the antenna switch. For example, the second RF shield may reduce RF coupling of Voltage Standing Waves of harmonic frequencies of an operating frequency of the power amplifier More specifically, the second RF shield may comprise a top, and a plurality of legs extending therefrom to the circuit board. Also, the second RF shield may comprise sidewall skirts extending from the top. For example, the top may be rectangular in shape.

In some embodiments, the second RF shield may have a corner extension extending outwardly from the top. In other embodiments, the second RF shield may include a plurality of passageways therethrough.

Furthermore, the mobile wireless communications device may further comprise a filter carried by the circuit board within the first RF shield and coupled to the power amplifier. In particular, the filter may comprise a harmonic filter associated with at least one harmonic of the power amplifier. For example, the first and second RF shields may comprise metal.

Another aspect is directed to a mobile wireless communications device. The mobile wireless communications device may comprise a housing, an antenna carried by the housing, a circuit board carried by the housing, a power amplifier carried by the circuit board, and an antenna switch carried by the circuit board and configured to selectively couple the power amplifier to the antenna. The mobile wireless communications device may further comprise a first radio frequency (RF) shield covering the power amplifier and the antenna switch, and a second RF shield within the first RF shield and covering the power amplifier.

Another aspect is directed to a mobile wireless communications device. The mobile wireless communications device may comprise a housing, an antenna carried by the housing, a circuit board carried by the housing, a power amplifier carried by the circuit board, and at least one post-amplifier stage carried by the circuit board and configured to selectively couple the power amplifier to the antenna. The mobile wireless communications device may further comprise a first radio frequency (RF) shield covering the power amplifier and the at least one post-amplifier stage, and a second RF shield within the first RF shield and covering the at least one post-amplifier stage.

Another aspect is directed to a method of making a mobile wireless communications device. The method may include providing a housing carrying an antenna and a circuit board, and coupling a power amplifier and an antenna switch to be carried by the circuit board, the antenna switch selectively coupling the power amplifier to the antenna. The method also includes positioning a first RF shield to cover the power amplifier and the antenna switch, and positioning a second RF shield within the first RF shield and to cover the antenna switch.

Another aspect is directed to a method of making a mobile wireless communications device. The method may include providing a housing carrying an antenna and a circuit board, and coupling a power amplifier and an antenna switch to be carried by the circuit board, the antenna switch selectively coupling the power amplifier to the antenna. The method also includes positioning a first RF shield to cover the power amplifier and the antenna switch, and positioning a second RF shield within the first RF shield and to cover the power amplifier.

Another aspect is directed to a method of making a mobile wireless communications device. The method may include providing a housing carrying an antenna and a circuit board, and coupling a power amplifier and at least one post-amplifier stage to be carried by the circuit board, the at least one post-amplifier stage selectively coupling the power amplifier to the antenna. The method also includes positioning a first RF shield to cover the power amplifier and the at least one post-amplifier stage, and positioning a second RF shield within the first RF shield and to cover the at least one post-amplifier stage.

Referring initially to FIG. 1, a mobile wireless communications device 10 according to the present embodiments is now described. The mobile wireless communications device 10 illustratively includes a housing 18, an antenna 30 carried by the housing, a circuit board 19 carried by the housing, a power amplifier 12 carried by the circuit board, and an antenna switch 15 carried by the circuit board and configured to selectively couple the power amplifier to the antenna.

As will be appreciated by those skilled in the art, the mobile wireless communications device 10 illustratively includes a test port 16 coupled between the antenna 30 and the antenna switch 15. The test port 16 is for determining the frequency characteristics of the transmission signal.

Furthermore, the mobile wireless communications device 10 illustratively includes a filter 13 carried by the circuit board 19 and coupled to the power amplifier 12. In some embodiments (illustrated embodiment included), the filter 13 comprises a harmonic filter associated with at least one harmonic of the power amplifier 12. The filter 13 removes undesired characteristics from the signal applied to the antenna 30. In particular, harmonics of the operation frequency of the power amplifier 12 are removed.

As will be appreciated by the skilled person, the power amplifier 12, the filter 13, and the antenna switch 15 may be on individual integrated circuits (ICs). In yet other embodiments, these devices may be on a single IC.

The mobile wireless communications device illustratively includes a first RF shield 11 covering the power amplifier 12, the filter 13, and the antenna switch 15. The mobile wireless communications device illustratively includes a second RF shield 14 within the first RF shield 11 and covering the antenna switch 15. For example, the second RF shield 15 reduces RF coupling of Voltage Standing Waves of harmonic frequencies of an operating frequency of the power amplifier 12. For example, the first 11 and second 14 RF shields may comprise a metal, such as steel, a rhodium steel alloy, or a nickel plated metal (steel).

Although the second RF shield 14 is illustrated as covering the antenna switch 15 and not the harmonic filter 13, in other embodiments, the harmonic filter and the antenna switch may be integrated onto a single chipset. Thereby, in these embodiments, the second RF shield 14 would also cover the harmonic filter 13 in addition to the antenna switch 15. Moreover, in yet other embodiments (FIG. 6), a plurality of post-amplifier stages may be integrated onto the same chipset as the antenna switch 15. In these other embodiments, the second RF shield 14 would also cover the plurality of post-amplifier stages.

More specifically, the second RF shield 14 illustratively includes a top 17, and a plurality of legs 21-23 extending therefrom to the circuit board 19. Also, the second RF shield 14 illustratively includes sidewall skirts 26-28 extending from the top 17. For example, the top 17 is illustratively rectangular in shape. Nevertheless, the top 17 may take other shapes in different embodiments, for example, circular or rectangular.

In the illustrated embodiment, the second RF shield 14 has a corner extension 20 extending outwardly from the top 17. In the illustrated embodiment, the corner extension 20 is rectangular in shape, but may have other forms, for example, triangular or curved. Moreover, the second RF shield 14 illustratively includes a plurality of passageways 25a-25c therethrough. In the illustrated embodiment, the passageways 25a-25c are circular in shape, but may have other forms, for example, triangular or rectangular etc.

Advantageously, the second RF shield 14 reduces the incidence of a standing wave from harmonics of the operation frequency of the power amplifier 12 by disrupting the standing wave within the first RF shield 11. Helpfully, this disruption diverts the standing wave away from the antenna switch 15, minimizing the coupling between the antenna switch and the standing wave.

Moreover, the sidewall skirts 26-28 in combination with the small footprint of the legs 21-23 permit mounting of integrated circuits under the second RF shield 14, which allows greater capacity and more efficient use of circuit board real estate. Additionally, the design of the second RF shield 14 does not separate the air volume within the first RF shield 11, as in typical "cans," which may be important from a heat dissipation perspective. The "table top" design of the top 17 of the second RF shield 14 adds to the shielding effects without affecting the air volume within the first RF shield 11.

Figure 5:
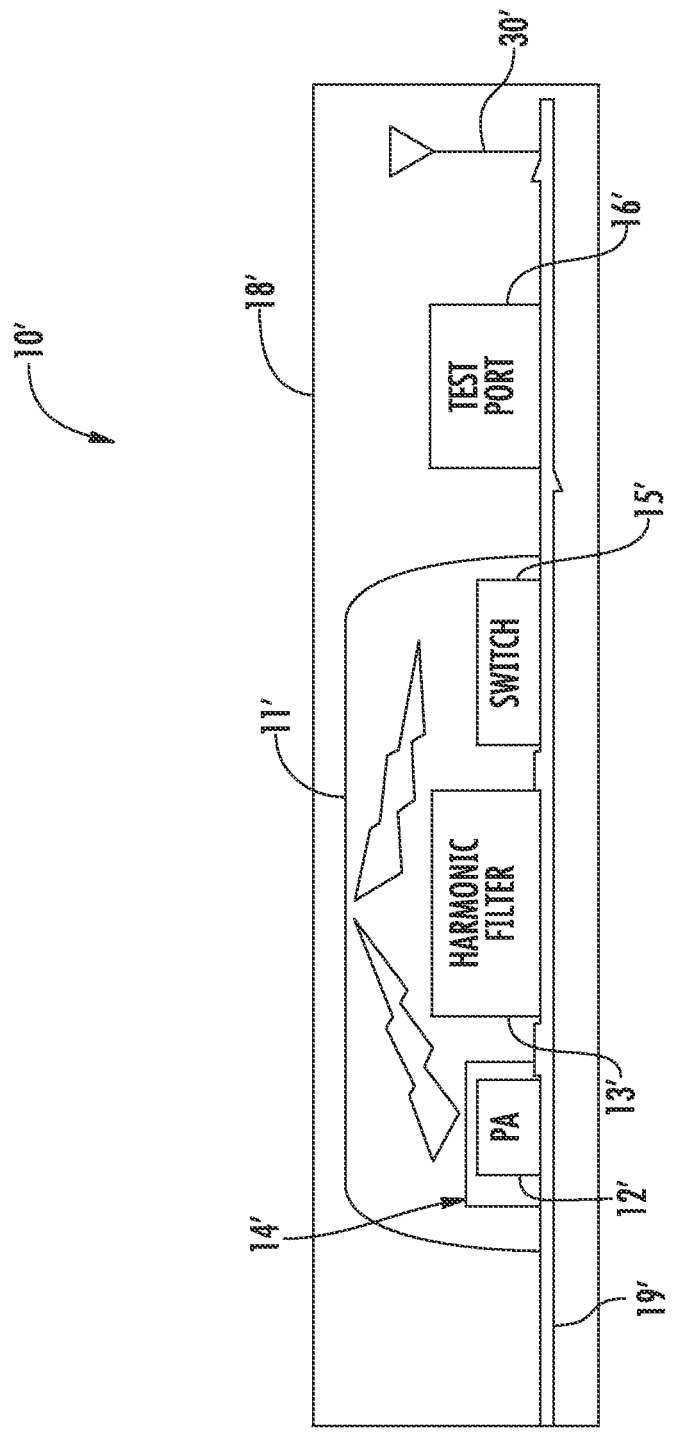
FIG. 5 is a schematic diagram of another embodiment of the mobile wireless communications device, according to the present disclosure.

Referring now briefly to FIG. 5, another embodiment of the mobile wireless communications device 10 is now described. In this embodiment of the mobile wireless communications device 10', those elements already discussed above with respect to FIGS. 1-4 are given prime notation and most require no further discussion herein. This embodiment differs from the previous embodiment in that the mobile wireless communications device 10' further includes the second RF shield 14' alternatively positioned over the power amplifier 12'. In yet other embodiments (not shown), a third RF shield similar in construction to the second RF shield 14' could additionally be placed over the antenna switch 15'.

Figure 6:
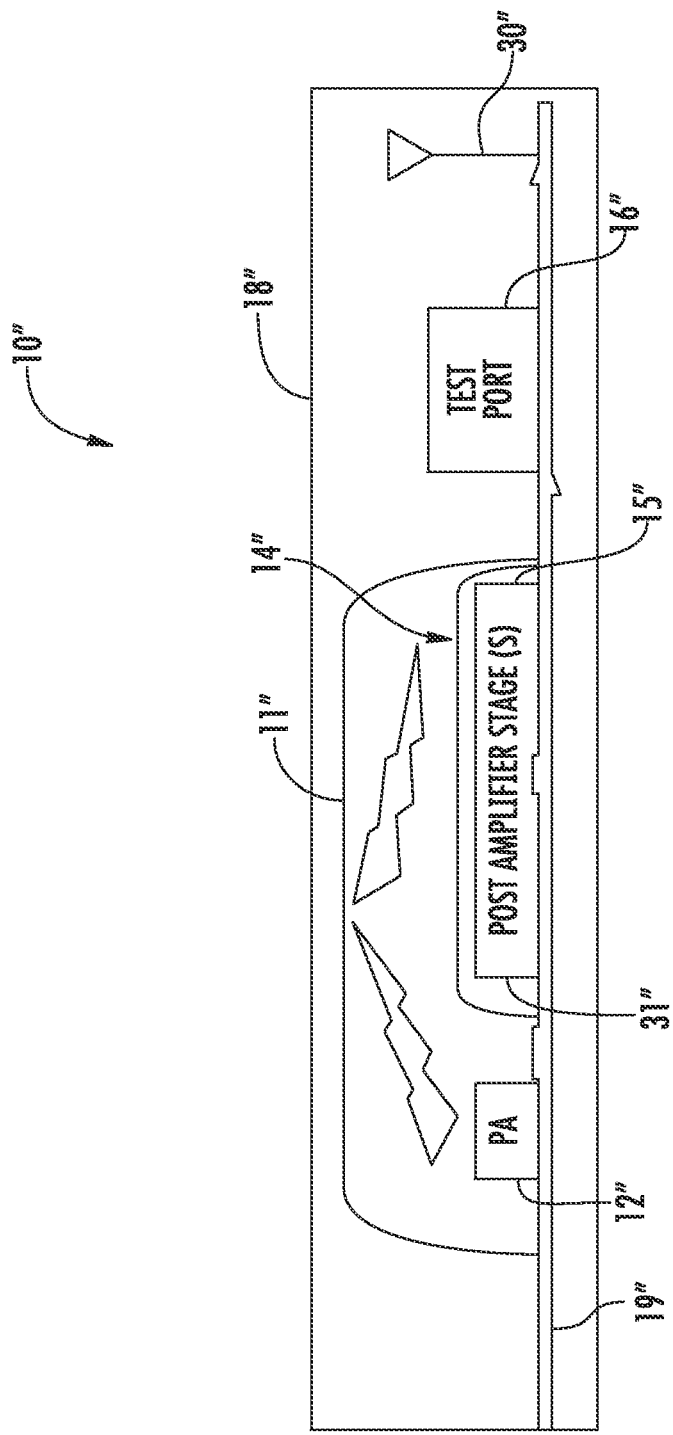
FIG. 6 is a schematic diagram of yet another embodiment of the mobile wireless communications device, according to the present disclosure.

Referring now briefly to FIG. 6, another embodiment of the mobile wireless communications device 10 is now described. In this embodiment of the mobile wireless communications device 10", those elements already discussed above with respect to FIGS. 1-4 are given double prime notation and most require no further discussion herein. This embodiment differs from the previous embodiment in that the mobile wireless communications device 10" includes the second RF shield 14' alternatively positioned over one or more post amplifier stages 31". The post amplifier stages 31" may include the filter and antenna switch (on-chip design, i.e. system on chip), for example. In yet other embodiments (not shown), a third RF shield similar in construction to the second RF shield 14" could additionally be placed over the power amplifier 12".

Example components of a mobile wireless communications device that may be used in accordance with an example embodiment are further described below with reference to FIGS. 7-10. Generally speaking, a mobile device may be configured according to an IT policy. It should be noted that the term IT policy, in general, refers to a collection of IT policy rules, in which the IT policy rules can be defined as being either grouped or non-grouped and global or per-user. The terms grouped, non-grouped, global and per-user are defined further below. Examples of applicable communication devices include pagers, cellular phones, cellular smartphones, wireless organizers, personal digital assistants, computers, laptops, handheld wireless communication devices, wirelessly enabled notebook computers and the like.

The mobile device is a two-way communication device with advanced data communication capabilities including the capability to communicate with other mobile devices or computer systems through a network of transceiver stations. The mobile device may also have the capability to allow voice communication. Depending on the functionality provided by the mobile device, it may be referred to as a data messaging device, a two-way pager, a cellular telephone with data messaging capabilities, a wireless Internet appliance, or a data communication device (with or without telephony capabilities). To aid the reader in understanding the structure of the mobile device and how it communicates with other devices and host systems, reference will now be made to FIGS. 7-10.

Figure 7:
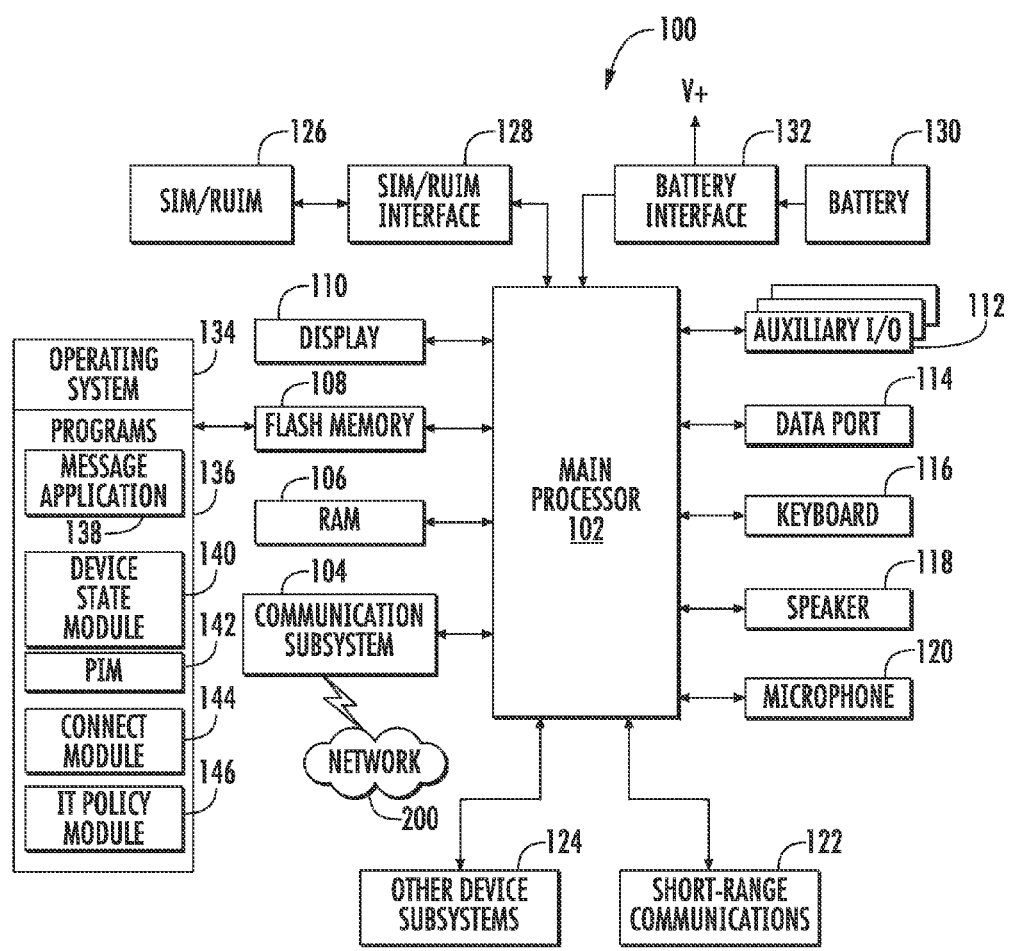
FIG. 7 is a schematic block diagram of an example embodiment of a mobile device that may be used with the second RF shield of FIGS. 1-6.

Referring first to FIG. 7, shown therein is a block diagram of an example embodiment of a mobile device 100. The mobile device 100 includes a number of components such as a main processor 102 that controls the overall operation of the mobile device 100. Communication functions, including data and voice communications, are performed through a communication subsystem 104. The communication subsystem 104 receives messages from and sends messages to a wireless network 200. In this example embodiment of the mobile device 100, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the example embodiments described herein are intended to use any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 200 associated with mobile device 100 is a GSM/GPRS wireless network in one example implementation, other wireless networks may also be associated with the mobile device 100 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems.

The main processor 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, short-range communications 122 and other device subsystems 124.

Some of the subsystems of the mobile device 100 perform communication-related functions, whereas other subsystems may provide "resident" or on-device functions. By way of example, the display 110 and the keyboard 116 may be used for both communication-related functions, such as entering a text message for transmission over the network 200, and device-resident functions such as a calculator or task list.

The mobile device 100 can send and receive communication signals over the wireless network 200 after required network registration or activation procedures have been completed. Network access is associated with a subscriber or user of the mobile device 100. To identify a subscriber, the mobile device 100 requires a SIM/RUIM card 126 (i.e., Subscriber Identity Module or a Removable User Identity Module) to be inserted into a SIM/RUIM interface 128 in order to communicate with a network. The SIM card or RUIM 126 is one type of a conventional "smart card" that can be used to identify a subscriber of the mobile device 100 and to personalize the mobile device 100, among other things. Without the SIM card 126, the mobile device 100 is not fully operational for communication with the wireless network 200. By inserting the SIM card/RUIM 126 into the SIM/RUIM interface 128, a subscriber can access all subscribed services. Services may include: web browsing and messaging such as email, voice mail, Short Message Service (SMS), and Multimedia Messaging Services (MMS). More advanced services may include: point of sale, field service and sales force automation. The SIM card/RUIM 126 includes a processor and memory for storing information. Once the SIM card/RUIM 126 is inserted into the SIM/RUIM interface 128, it is coupled to the main processor 102. In order to identify the subscriber, the SIM card/RUIM 126 can include some user parameters such as an International Mobile Subscriber Identity (IMSI). An advantage of using the SIM card/RUIM 126 is that a subscriber is not necessarily bound by any single physical mobile device. The SIM card/RUIM 126 may store additional subscriber information for a mobile device as well, including date book (or calendar) information and recent call information. Alternatively, user identification information can also be programmed into the flash memory 108.

The mobile device 100 is a battery-powered device and includes a battery interface 132 for receiving one or more rechargeable batteries 130. In at least some example embodiments, the battery 130 can be a smart battery with an embedded microprocessor. The battery interface 132 is coupled to a regulator (not shown), which assists the battery 130 in providing power V+ to the mobile device 100. Although current technology makes use of a battery, future technologies such as micro fuel cells may provide the power to the mobile device 100.

The mobile device 100 also includes an operating system 134 and software components 136 to 146 which are described in more detail below. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, will normally be installed on the mobile device 100 during its manufacture. Other software applications include a message application 138 that can be any suitable software program that allows a user of the mobile device 100 to send and receive electronic messages. Various alternatives exist for the message application 138 as is well known to those skilled in the art. Messages that have been sent or received by the user are typically stored in the flash memory 108 of the mobile device 100 or some other suitable storage element in the mobile device 100. In at least some example embodiments, some of the sent and received messages may be stored remotely from the device 100 such as in a data store of an associated host system that the mobile device 100 communicates with.

The software applications can further include a device state module 140, a Personal Information Manager (PIM) 142, and other suitable modules (not shown). The device state module 140 provides persistence, i.e., the device state module 140 ensures that important device data is stored in persistent memory, such as the flash memory 108, so that the data is not lost when the mobile device 100 is turned off or loses power.

The PIM 142 includes functionality for organizing and managing data items of interest to the user, such as, but not limited to, email, contacts, calendar events, voice mails, appointments, and task items. A PIM application has the ability to send and receive data items via the wireless network 200. PIM data items may be seamlessly integrated, synchronized, and updated via the wireless network 200 with the mobile device subscriber's corresponding data items stored and/or associated with a host computer system. This functionality creates a mirrored host computer on the mobile device 100 with respect to such items. This can be particularly advantageous when the host computer system is the mobile device subscriber's office computer system.

The mobile device 100 also includes a connect module 144, and an IT policy module 146. The connect module 144 implements the communication protocols that are required for the mobile device 100 to communicate with the wireless infrastructure and any host system, such as an enterprise system, that the mobile device 100 is authorized to interface with. Examples of a wireless infrastructure and an enterprise system are given in FIGS. 9 and 10, which are described in more detail below.

The connect module 144 includes a set of APIs that can be integrated with the mobile device 100 to allow the mobile device 100 to use any number of services associated with the enterprise system. The connect module 144 allows the mobile device 100 to establish an end-to-end secure, authenticated communication pipe with the host system. A subset of applications for which access is provided by the connect module 144 can be used to pass IT policy commands from the host system to the mobile device 100. This can be done in a wireless or wired manner. These instructions can then be passed to the IT policy module 146 to modify the configuration of the device 100. Alternatively, in some cases, the IT policy update can also be done over a wired connection.

The IT policy module 146 receives IT policy data that encodes the IT policy. The IT policy module 146 then ensures that the IT policy data is authenticated by the mobile device 100. The IT policy data can then be stored in the flash memory 106 in its native form. After the IT policy data is stored, a global notification can be sent by the IT policy module 146 to all of the applications residing on the mobile device 100. Applications for which the IT policy may be applicable then respond by reading the IT policy data to look for IT policy rules that are applicable.

The IT policy module 146 can include a parser (not shown), which can be used by the applications to read the IT policy rules. In some cases, another module or application can provide the parser. Grouped IT policy rules, described in more detail below, are retrieved as byte streams, which are then sent (recursively, in a sense) into the parser to determine the values of each IT policy rule defined within the grouped IT policy rule. In at least some example embodiments, the IT policy module 146 can determine which applications are affected by the IT policy data and send a notification to only those applications. In either of these cases, for applications that aren't running at the time of the notification, the applications can call the parser or the IT policy module 146 when they are executed to determine if there are any relevant IT policy rules in the newly received IT policy data.

All applications that support rules in the IT Policy are coded to know the type of data to expect. For example, the value that is set for the "WEP User Name" IT policy rule is known to be a string; therefore the value in the IT policy data that corresponds to this rule is interpreted as a string. As another example, the setting for the "Set Maximum Password Attempts" IT policy rule is known to be an integer, and therefore the value in the IT policy data that corresponds to this rule is interpreted as such.

After the IT policy rules have been applied to the applicable applications or configuration files, the IT policy module 146 sends an acknowledgement back to the host system to indicate that the IT policy data was received and successfully applied.

Other types of software applications can also be installed on the mobile device 100. These software applications can be third party applications, which are added after the manufacture of the mobile device 100. Examples of third party applications include games, calculators, utilities, etc.

The additional applications can be loaded onto the mobile device 100 through at least one of the wireless network 200, the auxiliary I/O subsystem 112, the data port 114, the short-range communications subsystem 122, or any other suitable device subsystem 124. This flexibility in application installation increases the functionality of the mobile device 100 and may provide enhanced on-device functions, communication-related functions, or both. For example, secure communication applications may enable electronic commerce functions and other such financial transactions to be performed using the mobile device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The data port 114 can be any suitable port that enables data communication between the mobile device 100 and another computing device. The data port 114 can be a serial or a parallel port. In some instances, the data port 114 can be a USB port that includes data lines for data transfer and a supply line that can provide a charging current to charge the battery 130 of the mobile device 100.

The short-range communications subsystem 122 provides for communication between the mobile device 100 and different systems or devices, without the use of the wireless network 200. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an email message, or web page download will be processed by the communication subsystem 104 and input to the main processor 102. The main processor 102 will then process the received signal for output to the display 110 or alternatively to the auxiliary I/O subsystem 112. A subscriber may also compose data items, such as email messages, for example, using the keyboard 116 in conjunction with the display 110 and possibly the auxiliary I/O subsystem 112. The auxiliary subsystem 112 may include devices such as: a touch screen, mouse, track ball, infrared fingerprint detector, or a roller wheel with dynamic button pressing capability. The keyboard 116 is preferably an alphanumeric keyboard and/or telephone-type keypad. However, other types of keyboards may also be used. A composed item may be transmitted over the wireless network 200 through the communication subsystem 104.

For voice communications, the overall operation of the mobile device 100 is substantially similar, except that the received signals are output to the speaker 118, and signals for transmission are generated by the microphone 120. Alternative voice or audio I/O subsystems, such as a voice message recording subsystem, can also be implemented on the mobile device 100. Although voice or audio signal output is accomplished primarily through the speaker 118, the display 110 can also be used to provide additional information such as the identity of a calling party, duration of a voice call, or other voice call related information.

Figure 8:
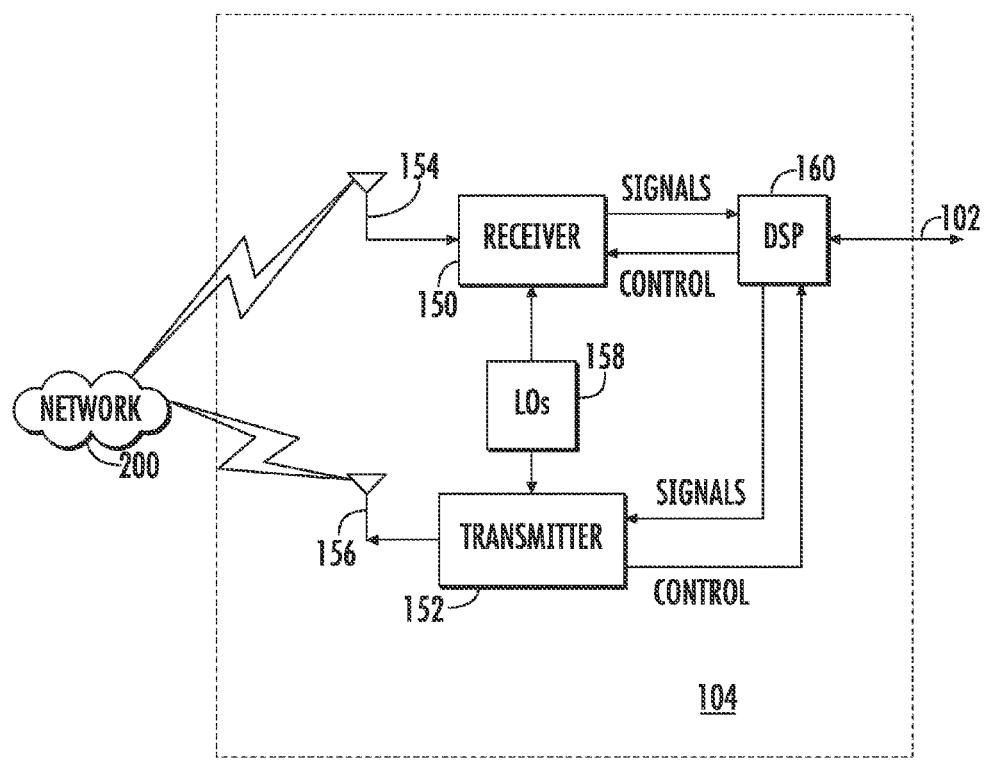
FIG. 8 is a schematic block diagram of an example embodiment of a communication subsystem component of the mobile device of FIG. 7.

Referring now to FIG. 8, an example block diagram of the communication subsystem component 104 is shown. The communication subsystem 104 includes a receiver 150, a transmitter 152, as well as associated components such as one or more embedded or internal antenna elements 154 and 156, Local Oscillators (LOs) 158, and a processing module such as a Digital Signal Processor (DSP) 160. The particular design of the communication subsystem 104 is dependent upon the communication network 200 with which the mobile device 100 is intended to operate. Thus, it should be understood that the design illustrated in FIG. 8 serves only as one example.

Signals received by the antenna 154 through the wireless network 200 are input to the receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the wireless network 200 via the antenna 156. The DSP 160 not only processes communication signals, but also provides for receiver and transmitter control. For example, the gains applied to communication signals in the receiver 150 and the transmitter 152 may be adaptively controlled through automatic gain control algorithms implemented in the DSP 160.

The wireless link between the mobile device 100 and the wireless network 200 can contain one or more different channels, typically different RF channels, and associated protocols used between the mobile device 100 and the wireless network 200. An RF channel is a limited resource that must be conserved, typically due to limits in overall bandwidth and limited battery power of the mobile device 100.

When the mobile device 100 is fully operational, the transmitter 152 is typically keyed or turned on only when it is transmitting to the wireless network 200 and is otherwise turned off to conserve resources. Similarly, the receiver 150 is periodically turned off to conserve power until it is needed to receive signals or information (if at all) during designated time periods.

Figure 9:
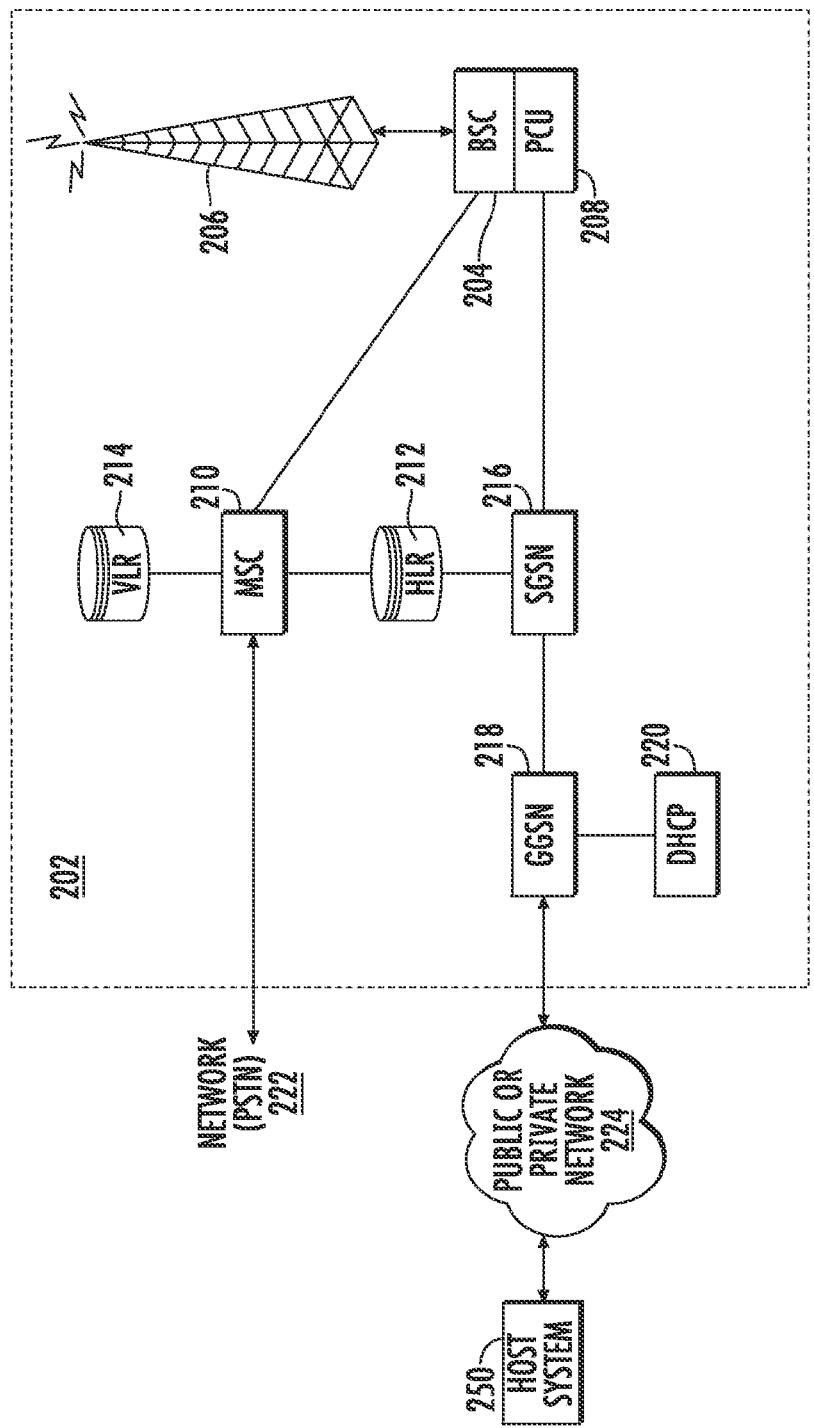
FIG. 9 is an example schematic block diagram of a node of a wireless network.

Referring now to FIG. 9, a block diagram of an example implementation of a node 202 of the wireless network 200 is shown. In practice, the wireless network 200 includes one or more nodes 202. In conjunction with the connect module 144, the mobile device 100 can communicate with the node 202 within the wireless network 200. In the example implementation of FIG. 9, the node 202 is configured in accordance with General Packet Radio Service (GPRS) and Global Systems for Mobile (GSM) technologies. The node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through the network 200.

In a GSM network, the MSC 210 is coupled to the BSC 204 and to a landline network, such as a Public Switched Telephone Network (PSTN) 222 to satisfy circuit switched requirements. The connection through the PCU 208, the SGSN 216 and the GGSN 218 to a public or private network (Internet) 224 (also referred to herein generally as a shared network infrastructure) represents the data path for GPRS capable mobile devices. In a GSM network extended with GPRS capabilities, the BSC 204 also contains the Packet Control Unit (PCU) 208 that connects to the SGSN 216 to control segmentation, radio channel allocation and to satisfy packet switched requirements. To track the location of the mobile device 100 and availability for both circuit switched and packet switched management, the HLR 212 is shared between the MSC 210 and the SGSN 216. Access to the VLR 214 is controlled by the MSC 210.

The station 206 is a fixed transceiver station and together with the BSC 204 form fixed transceiver equipment. The fixed transceiver equipment provides wireless network coverage for a particular coverage area commonly referred to as a "cell." The fixed transceiver equipment transmits communication signals to and receives communication signals from mobile devices within its cell via the station 206. The fixed transceiver equipment normally performs such functions as modulation and possibly encoding and/or encryption of signals to be transmitted to the mobile device 100 in accordance with particular, usually predetermined, communication protocols and parameters, under control of its controller. The fixed transceiver equipment similarly demodulates and possibly decodes and decrypts, if necessary, any communication signals received from the mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in the HLR 212. The HLR 212 also contains location information for each registered mobile device and can be queried to determine the current location of a mobile device. The MSC 210 is responsible for a group of location areas and stores the data of the mobile devices currently in its area of responsibility in the VLR 214. Further, the VLR 214 also contains information on mobile devices that are visiting other networks. The information in the VLR 214 includes part of the permanent mobile device data transmitted from the HLR 212 to the VLR 214 for faster access. By moving additional information from a remote HLR 212 node to the VLR 214, the amount of traffic between these nodes can be reduced so that voice and data services can be provided with faster response times and at the same time requiring less use of computing resources.

The SGSN 216 and the GGSN 218 are elements added for GPRS support, namely packet switched data support, within GSM. The SGSN 216 and the MSC 210 have similar responsibilities within the wireless network 200 by keeping track of the location of each mobile device 100. The SGSN 216 also performs security functions and access control for data traffic on the wireless network 200. The GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring the DHCP server 220 connected to the GGSN 218. There are many mechanisms for dynamic IP assignment, including using a combination of a Remote Authentication Dial-In User Service (RADIUS) server and a DHCP server.

Once the GPRS Attach is complete, a logical connection is established from a mobile device 100, through the PCU 208, and the SGSN 216 to an Access Point Node (APN) within the GGSN 218. The APN represents a logical end of an IP tunnel that can either access direct Internet compatible services or private network connections. The APN also represents a security mechanism for the network 200, insofar as each mobile device 100 must be assigned to one or more APNs and mobile devices 100 cannot exchange data without first performing a GPRS Attach to an APN that it has been authorized to use. The APN may be considered to be similar to an Internet domain name such as "myconnection.wireless.com."

Once the GPRS Attach operation is complete, a tunnel is created and all traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, the network 200 will run an idle timer for each PDP Context to determine if there is a lack of activity. When a mobile device 100 is not using its PDP Context, the PDP Context can be de-allocated and the IP address returned to the IP address pool managed by the DHCP server 220.

Figure 10:
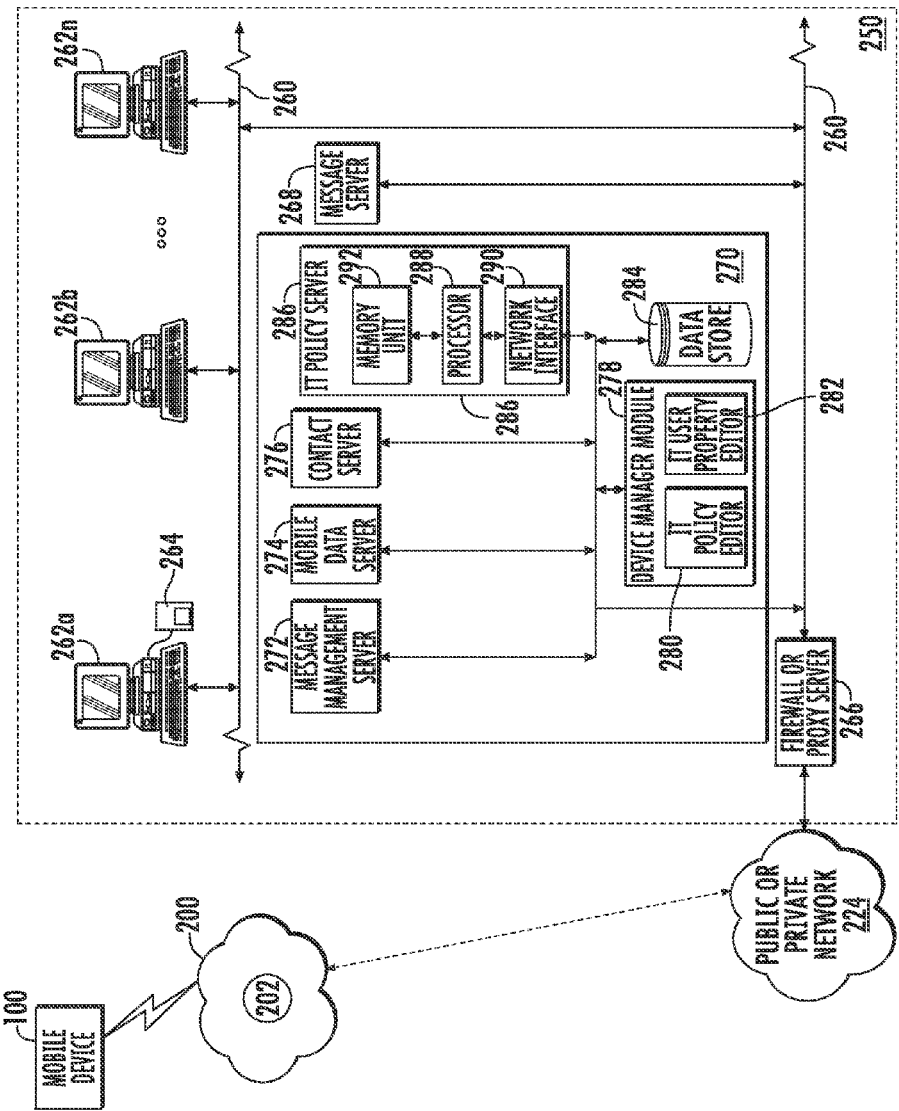
FIG. 10 is a schematic block diagram illustrating components of a host system in one example configuration for use with the wireless network of FIG. 9 and the mobile device of FIG. 7.

Referring now to FIG. 10, shown therein is a block diagram illustrating components of an example configuration of a host system 250 that the mobile device 100 can communicate with in conjunction with the connect module 144. The host system 250 will typically be a corporate enterprise or other local area network (LAN), but may also be a home office computer or some other private system, for example, in variant implementations. In this example shown in FIG. 10, the host system 250 is depicted as a LAN of an organization to which a user of the mobile device 100 belongs. Typically, a plurality of mobile devices can communicate wirelessly with the host system 250 through one or more nodes 202 of the wireless network 200.

The host system 250 includes a number of network components connected to each other by a network 260. For instance, a user's desktop computer 262a with an accompanying cradle 264 for the user's mobile device 100 is situated on a LAN connection. The cradle 264 for the mobile device 100 can be coupled to the computer 262a by a serial or a Universal Serial Bus (USB) connection, for example. Other user computers 262b-262n are also situated on the network 260, and each may or may not be equipped with an accompanying cradle 264. The cradle 264 facilitates the loading of information (e.g., PIM data, private symmetric encryption keys to facilitate secure communications) from the user computer 262a to the mobile device 100, and may be particularly useful for bulk information updates often performed in initializing the mobile device 100 for use. The information downloaded to the mobile device 100 may include certificates used in the exchange of messages.

It will be understood by persons skilled in the art that the user computers 262a-262n will typically also be connected to other peripheral devices, such as printers, etc. which are not explicitly shown in FIG. 10. Furthermore, only a subset of network components of the host system 250 are shown in FIG. 7 for ease of exposition, and it will be understood by persons skilled in the art that the host system 250 will include additional components that are not explicitly shown in FIG. 8 for this example configuration. More generally, the host system 250 may represent a smaller part of a larger network (not shown) of the organization, and may include different components and/or be arranged in different topologies than that shown in the example embodiment of FIG. 10.

To facilitate the operation of the mobile device 100 and the wireless communication of messages and message-related data between the mobile device 100 and components of the host system 250, a number of wireless communication support components 270 can be provided. In some implementations, the wireless communication support components 270 can include a message management server 272, a mobile data server 274, a contact server 276, and a device manager module 278. The device manager module 278 includes an IT Policy editor 280 and an IT user property editor 282, as well as other software components for allowing an IT administrator to configure the mobile devices 100. In an alternative example embodiment, there may be one editor that provides the functionality of both the IT policy editor 280 and the IT user property editor 282. The support components 270 also include a data store 284, and an IT policy server 286. The IT policy server 286 includes a processor 288, a network interface 290 and a memory unit 292. The processor 288 controls the operation of the IT policy server 286 and executes functions related to the standardized IT policy as described below. The network interface 290 allows the IT policy server 286 to communicate with the various components of the host system 250 and the mobile devices 100. The memory unit 292 can store functions used in implementing the IT policy as well as related data. Those skilled in the art know how to implement these various components. Other components may also be included as is well known to those skilled in the art. Further, in some implementations, the data store 284 can be part of any one of the servers.

In this example embodiment, the mobile device 100 communicates with the host system 250 through node 202 of the wireless network 200 and a shared network infrastructure 224 such as a service provider network or the public Internet. Access to the host system 250 may be provided through one or more routers (not shown), and computing devices of the host system 250 may operate from behind a firewall or proxy server 266. The proxy server 266 provides a secure node and a wireless internet gateway for the host system 250. The proxy server 266 intelligently routes data to the correct destination server within the host system 250.

In some implementations, the host system 250 can include a wireless VPN router (not shown) to facilitate data exchange between the host system 250 and the mobile device 100. The wireless VPN router allows a VPN connection to be established directly through a specific wireless network to the mobile device 100. The wireless VPN router can be used with the Internet Protocol (IP) Version 6 (IPV6) and IP-based wireless networks. This protocol can provide enough IP addresses so that each mobile device has a dedicated IP address, making it possible to push information to a mobile device at any time. An advantage of using a wireless VPN router is that it can be an off-the-shelf VPN component, and does not require a separate wireless gateway and separate wireless infrastructure. A VPN connection can preferably be a Transmission Control Protocol (TCP)/IP or User Datagram Protocol (UDP)/IP connection for delivering the messages directly to the mobile device 100 in this alternative implementation.

Messages intended for a user of the mobile device 100 are initially received by a message server 268 of the host system 250. Such messages may originate from any number of sources. For instance, a message may have been sent by a sender from the computer 262*b* within the host system 250, from a different mobile device (not shown) connected to the wireless network 200 or a different wireless network, or from a different computing device, or other device capable of sending messages, via the shared network infrastructure 224, possibly through an application service provider (ASP) or Internet service provider (ISP), for example.

The message server 268 typically acts as the primary interface for the exchange of messages, particularly email messages, within the organization and over the shared network infrastructure 224. Each user in the organization that has been set up to send and receive messages is typically associated with a user account managed by the message server 268. Some example implementations of the message server 268 include a Microsoft Exchange™ server, a Lotus Domino™ server, a Novell Groupwise™ server, or another suitable mail server installed in a corporate environment. In some implementations, the host system 250 may include multiple message servers 268. The message server 268 may also be adapted to provide additional functions beyond message management, including the management of data associated with calendars and task lists, for example.

When messages are received by the message server 268, they are typically stored in a data store associated with the message server 268. In at least some example embodiments, the data store may be a separate hardware unit, such as data store 284, that the message server 268 communicates with. Messages can be subsequently retrieved and delivered to users by accessing the message server 268. For instance, an email client application operating on a user's computer 262*a* may request the email messages associated with that user's account stored on the data store associated with the message server 268. These messages are then retrieved from the data store and stored locally on the computer 262*a*. The data store associated with the message server 268 can store copies of each message that is locally stored on the mobile device 100. Alternatively, the data store associated with the message server 268 can store all of the messages for the user of the mobile device 100 and only a smaller number of messages can be stored on the mobile device 100 to conserve memory. For instance, the most recent messages (i.e., those received in the past two to three months for example) can be stored on the mobile device 100.

When operating the mobile device 100, the user may wish to have email messages retrieved for delivery to the mobile device 100. The message application 138 operating on the mobile device 100 may also request messages associated with the user's account from the message server 268. The message application 138 may be configured (either by the user or by an administrator, possibly in accordance with an organization's information technology (IT) policy) to make this request at the direction of the user, at some pre-defined time interval, or upon the occurrence of some pre-defined event. In some implementations, the mobile device 100 is assigned its own email address, and messages addressed specifically to the mobile device 100 are automatically redirected to the mobile device 100 as they are received by the message server 268.

The message management server 272 can be used to specifically provide support for the management of messages, such as email messages, that are to be handled by mobile devices. Generally, while messages are still stored on the message server 268, the message management server 272 can be used to control when, if, and how messages are sent to the mobile device 100. The message management server 272 also facilitates the handling of messages composed on the mobile device 100, which are sent to the message server 268 for subsequent delivery.

For example, the message management server 272 may monitor the user's "mailbox" (e.g., the message store associated with the user's account on the message server 268) for new email messages, and apply user-definable filters to new messages to determine if and how the messages are relayed to the user's mobile device 100. The message management server 272 may also compress and encrypt new messages (e.g., using an encryption technique such as Data Encryption Standard (DES), Triple DES, or Advanced Encryption Standard (AES)) and push them to the mobile device 100 via the shared network infrastructure 224 and the wireless network 200. The message management server 272 may also receive messages composed on the mobile device 100 (e.g., encrypted using Triple DES), decrypt and decompress the composed messages, re-format the composed messages if desired so that they will appear to have originated from the user's computer 262a, and re-route the composed messages to the message server 268 for delivery.

Certain properties or restrictions associated with messages that are to be sent from and/or received by the mobile device 100 can be defined (e.g., by an administrator in accordance with IT policy) and enforced by the message management server 272. These may include whether the mobile device 100 may receive encrypted and/or signed messages, minimum encryption key sizes, whether outgoing messages must be encrypted and/or signed, and whether copies of all secure messages sent from the mobile device 100 are to be sent to a pre-defined copy address, for example.

The message management server 272 may also be adapted to provide other control functions, such as only pushing certain message information or pre-defined portions (e.g., "blocks") of a message stored on the message server 268 to the mobile device 100. For example, in some cases, when a message is initially retrieved by the mobile device 100 from the message server 268, the message management server 272 may push only the first part of a message to the mobile device 100, with the part being of a pre-defined size (e.g., 2 KB). The user can then request that more of the message be delivered in similar-sized blocks by the message management server 272 to the mobile device 100, possibly up to a maximum pre-defined message size. Accordingly, the message management server 272 facilitates better control over the type of data and the amount of data that is communicated to the mobile device 100, and can help to minimize potential waste of bandwidth or other resources.

The mobile data server 274 encompasses any other server that stores information that is relevant to the corporation. The mobile data server 274 may include, but is not limited to, databases, online data document repositories, customer relationship management (CRM) systems, or enterprise resource planning (ERP) applications.

The contact server 276 can provide information for a list of contacts for the user in a similar fashion as the address book on the mobile device 100. Accordingly, for a given contact, the contact server 276 can include the name, phone number, work address and email address of the contact, among other information. The contact server 276 can also provide a global address list that contains the contact information for all of the contacts associated with the host system 250.

It will be understood by persons skilled in the art that the message management server 272, the mobile data server 274, the contact server 276, the device manager module 278, the data store 284 and the IT policy server 286 do not need to be implemented on separate physical servers within the host system 250. For example, some or all of the functions associated with the message management server 272 may be integrated with the message server 268, or some other server in the host system 250. Alternatively, the host system 250 may include multiple message management servers 272, particularly in variant implementations where a large number of mobile devices need to be supported.

Alternatively, in some example embodiments, the IT policy server 286 can provide the IT policy editor 280, the IT user property editor 282 and the data store 284. In some cases, the IT policy server 286 can also provide the device manager module 278. The processor 288 of the IT policy server 286 can be used to perform the various steps of a method for providing IT policy data that is customizable on a per-user basis. The processor 288 can execute the editors 280 and 282. In some cases, the functionality of the editors 280 and 282 can be provided by a single editor. In some cases, the memory unit 292 can provide the data store 284.

The device manager module 278 provides an IT administrator with a graphical user interface with which the IT administrator interacts to configure various settings for the mobile devices 100. As mentioned, the IT administrator can use IT policy rules to define behaviors of certain applications on the mobile device 100 that are permitted such as phone, web browser or Instant Messenger use. The IT policy rules can also be used to set specific values for configuration settings that an organization requires on the mobile devices 100 such as auto signature text, WLAN/VoIP/VPN configuration, security requirements (e.g., encryption algorithms, password rules, etc.), specifying themes or applications that are allowed to run on the mobile device 100, and the like.

Many modifications and other example embodiments of the present disclose will come to the mind of one skilled in the art having the benefit of the teachings presented in the foregoing descriptions and the associated drawings. Therefore, it is understood that the present disclosure is not to be limited to the specific example embodiments disclosed, and that modifications and example embodiments are intended to be included within the scope of the appended claims.

That which is claimed is:

1. A mobile wireless communications device comprising:
a housing;
an antenna carried by said housing;
a circuit board carried by said housing;
a first radio frequency (RF) shield covering at least a portion of said circuit board; and
a second RF shield within said first RF shield and comprising a top, and a corner extension extending outwardly from said top.

2. The mobile wireless communications device according to claim 1 wherein said corner extension has at least one of a rectangular, triangular and curved shape.

3. The mobile wireless communications device according to claim 1 further comprising a power amplifier carried by said circuit board and covered by at least said first RF shield.

4. The mobile wireless communications device according to claim 3 wherein said power amplifier is also covered by said second RF shield.

5. The mobile wireless communications device according to claim 1 further comprising an antenna switch carried by said circuit board and covered by at least said first RF shield.

6. The mobile wireless communications device according to claim 5 wherein said antenna switch is also covered by said second RF shield.

7. The mobile wireless communications device according to claim 1 further comprising a filter carried by said circuit board and covered by at least said first RF shield.

8. The mobile wireless communications device according to claim 7 wherein said filter is also covered by said second RF shield.

9. The mobile wireless communications device according to claim 1 wherein said second RF shield comprises a plurality of legs extending from said top toward said circuit board.

10. The mobile wireless communications device according to claim 1 wherein said second RF shield comprises a plurality of sidewall skirts at least partially extending from said top toward said circuit board.

11. The mobile wireless communications device according to claim 1 wherein said top has a plurality of passageways therethrough.

12. The mobile wireless communications device according to claim 1 wherein said top has a rectangular shape.

13. The mobile wireless communications device according to claim 1 wherein said first and second RF shields each comprises metal.

14. A mobile wireless communications device comprising:
a housing;
an antenna carried by said housing;
a circuit board carried by said housing;
a first radio frequency (RF) shield covering at least a portion of said circuit board; and
a second RF shield within said first RF shield and comprising a top having a plurality of passageway therethrough, and a corner extension extending outwardly from said top;
said first and second RF shields each comprising metal.

15. The mobile wireless communications device according to claim 14 wherein said corner extension has at least one of a rectangular, triangular and curved shape.

16. The mobile wireless communications device according to claim 14 further comprising a power amplifier carried by said circuit board and covered by at least said first RF shield.

17. The mobile wireless communications device according to claim 16 wherein said power amplifier is also covered by said second RF shield.

18. The mobile wireless communications device according to claim 14 further comprising an antenna switch carried by said circuit board and covered by at least said first RF shield.

19. The mobile wireless communications device according to claim 18 wherein said antenna switch is also covered by said second RF shield.

20. The mobile wireless communications device according to claim 14 further comprising a filter carried by said circuit board and covered by at least said first RF shield.

21. The mobile wireless communications device according to claim 20 wherein said filter is also covered by said second RF shield.

22. The mobile wireless communications device according to claim 14 wherein said second RF shield comprises a plurality of legs extending from said top toward said circuit board.

23. The mobile wireless communications device according to claim 14 wherein said second RF shield comprises a plurality of sidewall skirts at least partially extending from said top toward said circuit board.

24. A method of making a mobile wireless communications device comprising:
providing a housing carrying an antenna and a circuit board;
positioning a first radio frequency (RF) shield to cover at least a portion of the circuit board; and
positioning a second RF shield within the first RF shield and comprising a top, and a corner extension extending outwardly from the top.

25. The method according to claim 24 wherein the corner extension has at least one of a rectangular, triangular and curved shape.

26. The method according to claim 24 further comprising positioning a power amplifier on the circuit board and covered by at least the first RF shield.

27. The method according to claim 26 wherein the power amplifier is also covered by the second RF shield.

28. The method according to claim 24 further comprising positioning an antenna switch on the circuit board and covered by at least the first RF shield.

29. The method according to claim 28 wherein the antenna switch is also covered by the second RF shield.

30. The method according to claim 24 further comprising poisoning a filter on the circuit board and covered by at least the first RF shield.

31. The method according to claim 30 wherein the filter is also covered by the second RF shield.

32. The method according to claim 24 wherein the second RF shield comprises a plurality of legs extending from the top toward the circuit board.

33. The method according to claim 24 wherein the second RF shield comprises a plurality of sidewall skirts at least partially extending from the top toward the circuit board.

34. The method according to claim 24 wherein the top has a plurality of passageways therethrough.

* * * * *